(12) United States Patent
Wieczorek et al.

(10) Patent No.: US 6,838,363 B2
(45) Date of Patent: Jan. 4, 2005

(54) CIRCUIT ELEMENT HAVING A METAL SILICIDE REGION THERMALLY STABILIZED BY A BARRIER DIFFUSION MATERIAL

(75) Inventors: Karsten Wieczorek, Dresden (DE); Thorsten Kammler, Ottendorf-Okrilla (DE); Manfred Horstmann, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/402,585

(22) Filed: Mar. 28, 2003

(65) Prior Publication Data

US 2004/0061228 A1 Apr. 1, 2004

(30) Foreign Application Priority Data

Sep. 30, 2002 (DE) ........................................ 102 45 607

(51) Int. Cl.[7] .......................................... H01L 21/425
(52) U.S. Cl. ...................... 438/528; 438/592; 438/653
(58) Field of Search ................................ 438/407, 528, 438/530, 592, 653, 655, 656, 659, 660

(56) References Cited

U.S. PATENT DOCUMENTS

| | | | | |
|---|---|---|---|---|
| 5,444,024 A | | 8/1995 | Anjum et al. ............... | 437/200 |
| 5,950,098 A | | 9/1999 | Oda et al. .................... | 438/527 |
| 6,008,124 A | | 12/1999 | Sekiguchi et al. .......... | 438/653 |
| 6,054,386 A | * | 4/2000 | Prabhakar .................... | 438/655 |
| 6,242,785 B1 | * | 6/2001 | Hossain et al. ............. | 257/412 |
| 6,274,447 B1 | | 8/2001 | Takasou ....................... | 438/305 |
| 6,306,763 B1 | * | 10/2001 | Gardner et al. ............. | 438/659 |
| 6,383,880 B1 | | 5/2002 | Ngo et al. ................... | 438/303 |
| 6,586,333 B1 | | 7/2003 | Woo et al. ................... | 438/682 |
| 2002/0061639 A1 | * | 5/2002 | Itonaga ........................ | 438/592 |
| 2002/0064918 A1 | * | 5/2002 | Lee et al. .................... | 438/655 |

FOREIGN PATENT DOCUMENTS

WO    WO 04/001826 A1    12/2003    ......... H01L/21/285

OTHER PUBLICATIONS

Ghandhi, "VLSI Fabrication Principles", 1983, pp. 353–354.*

Cheng et al., "Effects of nitrogen ion implantation on the formation of nickel silicide contacts on shallow junctions," *Thin Solid Films*, 355–356:412–16, 1999.

Lee et al., "Improved NiSi Salicide Process Using Presilicide N$^{+}$2 Implant for MOSFETs," *Electron Device Letters*, vol. 21, 2000.

Tien–Sheng Chao and Liang Yao Lee, "Performance Improvement of Nickel Salicided n–Type Metal Oxide Semiconductor Field Effect Transistors by Nitrogen Implantation," *Jpn. J. Appl. Phys.*, 41:L381–83, 2002.

* cited by examiner

Primary Examiner—Chandra Chaudhari
(74) Attorney, Agent, or Firm—Williams, Morgan & Amerson, P.C.

(57) ABSTRACT

The introduction of a barrier diffusion material, such as nitrogen, into a silicon-containing conductive region, for example the drain and source regions and the gate electrode of a field effect transistor, allows the formation of nickel silicide, which is substantially thermally stable up to temperatures of 500° C. Thus, the device performance may significantly improve as the sheet resistance of nickel silicide is significantly less than that of nickel disilicide.

24 Claims, 3 Drawing Sheets

CIRCUIT ELEMENT HAVING A METAL SILICIDE REGION THERMALLY STABILIZED BY A BARRIER DIFFUSION MATERIAL

BACKGROUND OF THE INVENTION

1. Field of the Invention

Generally, the present invention relates to the fabrication of integrated circuits, and, more particularly, to the formation of metal silicide regions on silicon-containing conductive circuit elements to decrease a sheet resistance thereof

2. Description of the Related Art

In modern ultra-high density integrated circuits, device features are steadily decreasing to enhance device performance and functionality of the circuit. Shrinking the feature sizes, however, entails certain problems that may partially offset the advantages obtained by reducing the feature sizes. Generally, reducing the size of, for example, a transistor element such as a MOS transistor, may lead to superior performance characteristics due to a decreased channel length of the transistor element, resulting in a higher drive current capability and enhanced switching speed. Upon decreasing the channel length of the transistor elements, however, the electrical resistance of conductive lines and contact regions, i.e., regions that provide electrical contact to the periphery of the transistor elements, becomes a major issue since the cross-sectional area of these lines and regions is also reduced. The cross-sectional area, however, determines, in combination with the characteristics of the material comprising the conductive lines and contact regions, the effective electrical resistance thereof.

Moreover, a higher number of circuit elements per units area also requires an increased number of interconnections between these circuit elements, wherein, commonly, the number of required interconnects increases in a non-linear manner with the number of circuit elements so that the available real estate for interconnects becomes even more limited.

The majority of integrated circuits are based on silicon, that is, most of the circuit elements contain silicon regions, in crystalline, polycrystalline and amorphous form, doped and undoped, which act as conductive areas. An illustrative example in this context is a gate electrode of a MOS transistor element, which may be considered as a polysilicon line. Upon application of an appropriate control voltage to the gate electrode, a conductive channel is formed at the interface of a thin gate insulation layer and an active region of the semiconducting substrate. Although reducing the feature size of a transistor element improves device performance due to the reduced channel length, the shrinkage of the gate electrode, however, may result in significant delays in the signal propagation along the gate electrode, i.e., the formation of the channel along the entire extension of the gate electrode. The issue of signal propagation delay is even exacerbated for polysilicon lines connecting individual circuit elements or different chip regions. Therefore, it is extremely important to improve the sheet resistance of polysilicon lines and other silicon-containing contact regions to allow further device scaling without compromising device performance. For this reason, it has become standard practice to reduce the sheet resistance of polysilicon lines and silicon contact regions by forming a metal silicide in and on appropriate portions of the respective silicon-containing regions.

With reference to FIGS. 1a–1c, a typical prior art process flow for forming metal silicide on a corresponding portion of a MOS transistor element will now be described as an illustrative example for demonstrating the reduction of the sheet resistance of silicon.

FIG. 1a schematically shows a cross-sectional view of a transistor element 100, such as a MOS transistor, that is formed on a substrate 101 including a silicon-containing active region 102. The active region 102 is enclosed by an isolation structure 103, which in the present example is provided in the form of a shallow trench isolation usually used for sophisticated integrated circuits. Highly doped source and drain regions 104, including extension regions 105 that usually comprise a dopant concentration less than the highly doped regions 104, are formed in the active region 102. The source and drain regions 104, including the extension regions 105, are laterally separated by a channel region 106. A gate insulation layer 107 electrically and physically isolates a gate electrode 108 from the underlying channel region 106. Spacer elements 109 are formed on sidewalls of the gate electrode 108. A refractory metal layer 110 is formed over the transistor element 100 with a thickness required for the further processing in forming metal silicide portions.

A typical conventional process flow for forming the transistor element 100, as shown in FIG. 1a, may include the following steps. After defining the active region 102 by forming the shallow trench isolations 103 by means of advanced photolithography and etch techniques, well-established and well-known implantation steps are carried out to create a desired dopant profile in the active region 102 and the channel region 106.

Subsequently, the gate insulation layer 107 and the gate electrode 108 are formed by sophisticated deposition, photolithography and anisotropic etch techniques to obtain a desired gate length, which is the horizontal extension of the gate electrode 108 in FIG. 1a, i.e., in the plane of the drawing of FIG. 1a. Thereafter, a first implant sequence may be carried out to form the extension regions 105 wherein, depending on design requirements, additional so-called halo implants may be performed.

The spacer elements 109 are then formed by depositing a dielectric material, such as silicon dioxide and/or silicon nitride, and patterning the dielectric material by an anisotropic etch process. Thereafter, a further implant process may be carried out to form the heavily doped source and drain regions 104.

Subsequently, the refractory metal layer 110 is deposited on the transistor element 100 by, for example, chemical vapor deposition (CVD) or physical vapor deposition (PVD). Preferably a refractory metal, such as titanium, cobalt, nickel and the like, is used for the metal layer 110. It turns out, however, that the characteristics of the various refractory metals during forming of a metal silicide and afterwards in the form of a metal silicide significantly differ from each other. Consequently, selecting an appropriate metal depends on further design parameters of the transistor element 100 as well as on process requirements in following processes. For instance, titanium is frequently used for forming a metal silicide on the respective silicon-containing portions wherein, however, the electrical properties of the resulting titanium silicide strongly depend on the dimensions of the transistor element 100. Titanium silicide tends to agglomerate at grain boundaries of polysilicon and therefore may increase the total electrical resistance, wherein this effect is pronounced with decreasing feature sizes so that the employment of titanium may not be acceptable for polysilicon lines, such as the gate electrode 108, having a lateral dimension, i.e., a gate length of 0.5 $\mu$m and less.

For circuit elements having feature sizes of this order of magnitude, cobalt is preferably used as a refractory metal, since cobalt substantially does not exhibit a tendency for blocking grain boundaries of the polysilicon. Although cobalt may successfully be used for feature sizes down to 0.2 µm, a further reduction of the feature size may require a metal silicide exhibiting a significantly lower sheet resistance than cobalt silicide for the following reason. In a typical MOS process flow, the metal silicide is formed on the gate electrode 108 and the drain and the source regions 104 simultaneously in a so-called self-aligned process. This process flow requires taking into account that, for reduced feature sizes, a vertical extension or depth (with respect to FIG. 1a) of the drain and source regions 104 into the active region 102 also needs to be reduced to suppress so-called short-channel effects. Consequently, a vertical extension or depth of a metal silicide region formed on the gate electrode 108, which should desirably have a vertical extension as large as possible in view of decreasing the gate resistance, is limited by the requirement for shallow or thin metal silicide regions on the drain and source regions.

Therefore, for highly sophisticated transistor elements, nickel is increasingly considered as an appropriate substitute for cobalt as nickel silicide shows a significantly lower sheet resistance than cobalt silicide. In the following it is, therefore, assumed that the metal layer 110 is substantially comprised of nickel.

After deposition of the metal layer 110, a heat treatment is carried out to initiate a chemical reaction between the nickel atoms and the silicon atoms in those areas of the source and drain regions 104 and the gate electrode 108 that are in contact with the nickel. For example, a rapid thermal anneal cycle may be carried out with a temperature in the range of approximately 400–600° C. and for a time period of approximately 30–90 seconds. During the heat treatment, silicon and nickel atoms diffuse and combine to form nickel monosilicide.

FIG. 1b schematically shows the transistor element 100 with correspondingly formed nickel silicide layers 111 in the source and drain regions 104 and a nickel silicide layer 112 formed in the gate electrode 108. A respective thickness 111a and 112a of the nickel silicide layers 111, 112 may be adjusted by process parameters, such as a thickness of the initial metal layer 110 and/or the specified conditions during the heat treatment. For example, the metal layer 110 may be deposited with a specified thickness, and the temperature and/or the duration of the heat treatment are adjusted so that substantially the entire nickel layer is converted into nickel silicide. Alternatively, the metal layer 110 is deposited with a sufficient thickness and the degree of nickel silicide generation is controlled by the temperature and/or the duration of the heat treatment. Irrespective of the way to control the thickness 111a, 112a, the non-reacted nickel is then selectively removed by any suitable selective wet etch process, as are well known in the art. It should be noted that the silicon contained in the sidewall spacer elements 109 and the shallow trench isolations 103 does not substantially take part in the chemical reaction as the silicon therein is provided as a thermally stable oxide. Moreover, the nickel silicide layers 111, 112 may also be formed in a two-step thermal process, for example by two rapid thermal anneal cycles, wherein, preferably, non-reacted nickel may selectively be removed between the two cycles.

Although the thickness 111a may differ from the thickness 112a, due to a different diffusion behavior of the highly doped crystalline silicon of the drain and source regions 104 and the doped polysilicon of the gate electrode 108, both thicknesses are correlated as they may not be adjusted independently from each other without considerably changing the entire process flow, and therefore a maximum thickness 112a of nickel silicide on the gate electrode 108 is determined by the maximum allowable thickness 111a, which in turn is restricted by the depth of the drain and source region 104. Despite of the fact that nickel silicide exhibits a significantly lower sheet resistance than, for example, cobalt silicide, it turns out that nickel silicide is thermally not stable at temperatures exceeding approximately 400° C. and converts upon elevated temperatures to nickel disilicide. The formation of nickel disilicide instead of nickel silicide is highly undesirable since nickel disilicide has a significantly higher sheet resistance than nickel monosilicide. Moreover, the ongoing chemical reaction consumes further silicon and thus increases the thickness of the corresponding nickel silicide layers.

FIG. 1c schematically shows the transistor element 100 in a further advanced manufacturing stage after the transistor element 100 has "experienced" further heat treatments with elevated temperatures, such as anneal cycles carried out during the formation of metallization layers (not shown) and the like. Owing to the elevated temperatures, the nickel silicide in the layers 111, 112 may, to a high degree, be converted into nickel disilicide, thereby producing an increased thickness 111b and 112b, respectively, due to the doubled silicon consumption of nickel disilicide compared to nickel silicide. Since the amount of nickel disilicide created by any post-silicidation processes is difficult to control, the junction integrity, i.e., the integrity of the interface between the source and drain regions 104 and the active region 102, may not be guaranteed as is shown in FIG. 1c. These issues may entail a limited ability to scale the junction depth in accordance with device requirements for a transistor element in the deep sub-micron regime. Moreover, the increased sheet resistance of the nickel disilicide partially offsets, depending on the ratio of nickel silicide to nickel disilicide, the advantage obtained by replacing cobalt with nickel.

In view of the situation described above, it would, therefore, be highly desirable to eliminate or at least reduce some of the problems involved in processing nickel in highly sophisticated integrated circuits.

SUMMARY OF THE INVENTION

Generally, the present invention is based on the concept of thermally stabilizing nickel silicide by introducing a material into the nickel silicide that significantly hinders the inter-diffusion of silicon and nickel during elevated temperatures to thereby suppress or at least significantly reduce the formation of nickel disilicide. Appropriate materials that will herein also be referred to as diffusion barrier materials may include nitrogen and/or any noble gases, such as argon, xenon, krypton and the like.

According to one illustrative embodiment of the present invention, a method of forming a metal silicide comprises the provision of a substrate having formed thereon a silicon region with a surface area for receiving the metal silicide. Then, a diffusion barrier material is introduced into the silicon region via the surface area. A metal layer is then deposited such that the metal layer is in contact with the surface area, and at least a portion of the metal layer is converted into metal silicide to form a metal silicide layer, wherein barrier diffusion material is incorporated into the metal silicide to thermally stabilize the metal silicide.

According to a further illustrative embodiment of the present invention, a method of forming a nickel silicide layer in a conductive silicon-containing region comprises providing a substrate having formed thereon the conductive silicon-containing region. Nitrogen is introduced into the conductive silicon-containing region and a nickel-containing layer is formed over the conductive silicon-containing region, wherein the nickel-containing layer is partially in contact with the conductive silicon-containing region. Finally, a portion of the nickel-containing layer is converted into a nitrogen-containing nickel silicide layer.

According to a further illustrative embodiment of the present invention, a circuit element in an integrated circuit comprises a conductive silicon-containing region and a barrier diffusion material containing a nickel silicide layer located on a surface portion of the conductive silicon-containing region.

In still another exemplary embodiment of the present invention a field effect transistor comprises an active region formed in a silicon-containing region and a gate insulation layer formed over the active region. A gate electrode is formed on the gate insulation layer and a barrier diffusion material containing a nickel silicide layer is formed in the active region and the gate electrode.

BRIEF DESCRIPTION OF THE DRAWINGS

The invention may be understood by reference to the following description taken in conjunction with the accompanying drawings, in which like reference numerals identify like elements, and in which.

Figure 1A:
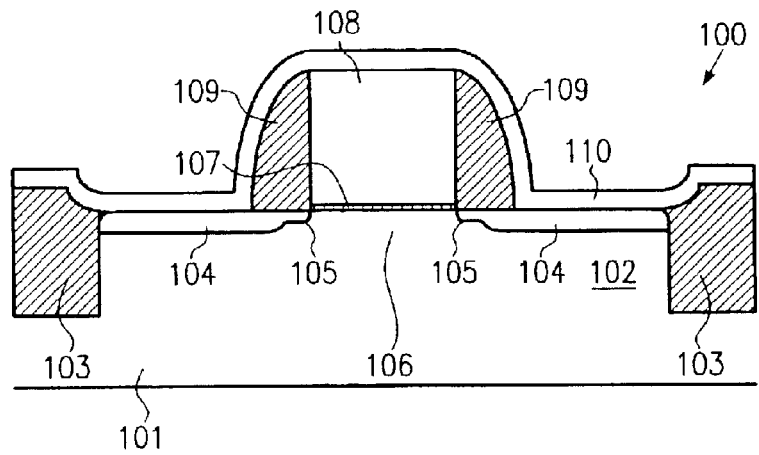
FIGS. 1a–1c schematically show cross-sectional views of a conventional transistor element during various stages of the manufacturing process.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It should be noted that in the following illustrative embodiments of the present invention, a field effect transistor, such as a CMOS transistor element, is discussed to demonstrate the principle of improving the conductivity of silicon-containing conductive regions by enhancing the thermal stability of a metal silicide formed in those regions. The present invention may, however, be readily applied to any silicon-containing regions, for example, provided in the form of doped or undoped crystalline silicon, doped or undoped polycrystalline silicon and doped or undoped amorphous silicon, irrespective of the type of circuit element of interest. For example, any polysilicon lines or areas connecting adjacent circuit elements, such as transistors, resistors, capacitors and the like, or connecting different chip areas, as well as certain silicon-containing portions of any type of circuit elements, for example, electrodes of capacitors, contact portions of resistors and the like, are to be understood to be encompassed by the present invention and should be considered as represented by the silicon-containing conductive region included in the transistor element described with reference to FIGS. 2a–2e in the following illustrative embodiments.

Figure 2A:
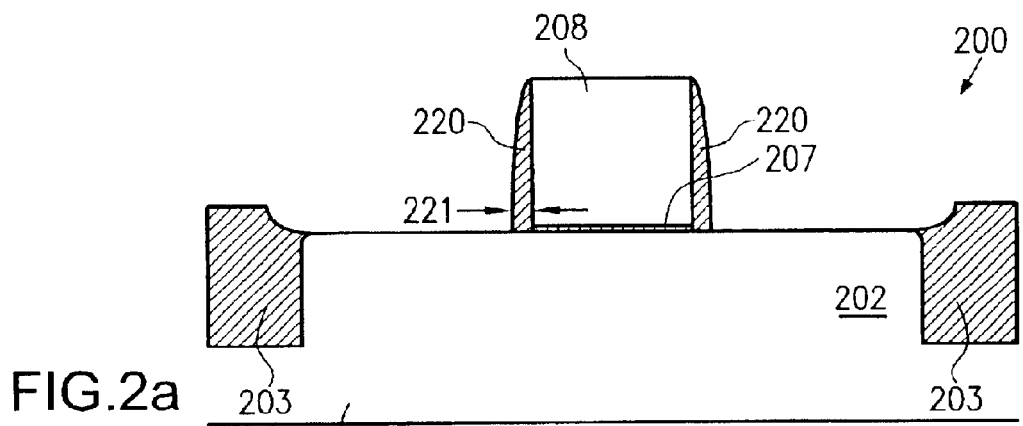
FIGS. 2a–2e schematically show cross-sectional views of silicon-containing conductive regions in the form of a transistor element during various manufacturing stages in accordance with illustrative embodiments of the present invention.

FIG. 2a schematically shows a schematic cross-sectional view of a transistor element 200 including a substrate 201, which may be a silicon substrate or any other appropriate substrate having formed thereon a silicon-containing crystalline layer to define therein an active region 202 enclosed by an isolation structure 203, such as a shallow trench isolation. A gate electrode 208 formed of polycrystalline silicon is formed over the active region 202 and is separated therefrom by a gate insulation layer 207. Sidewall spacers 220 having a specified thickness 221 are formed on the sidewalls of the gate electrode 208. The sidewall spacers 220 may be comprised of silicon dioxide, silicon nitride or any other appropriate material, wherein the thickness 221 of the spacers 220 is selected in accordance with process requirements and may range for typical embodiments from approximately 10–100 nm.

A typical process flow for forming the transistor element 200, as shown in FIG. 2a, may be as follows. After formation of the shallow trench isolations 203, implant steps may be carried out (not shown) to define a required dopant profile in the active region 202. Thereafter, the gate insulation layer 207 is formed by first growing and/or depositing an appropriate dielectric material, such as silicon dioxide, silicon nitride, silicon oxynitride or any combination thereof, or in case of highly sophisticated devices, the gate insulation layer 207 may comprise a high k material. Then, polysilicon is deposited and the gate dielectric and the polysilicon are patterned by sophisticated photolithography and anisotropic etch techniques to form the gate insulation layer 207 and the gate electrode 208. Subsequently, the sidewall spacers 220 are formed by well-known spacer techniques, for example, by depositing an appropriate material, such as silicon dioxide and the like, and by anisotropically etching the material, wherein the specified width 221 is substantially defined by the initial layer thickness.

Figure 1B:
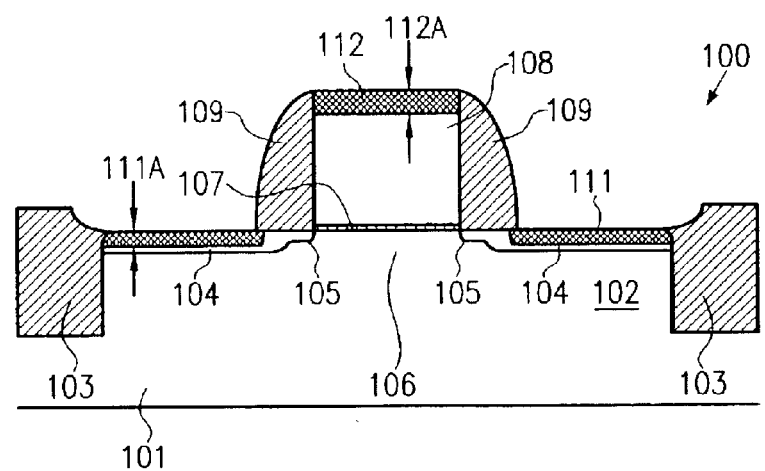
Figure 1C:
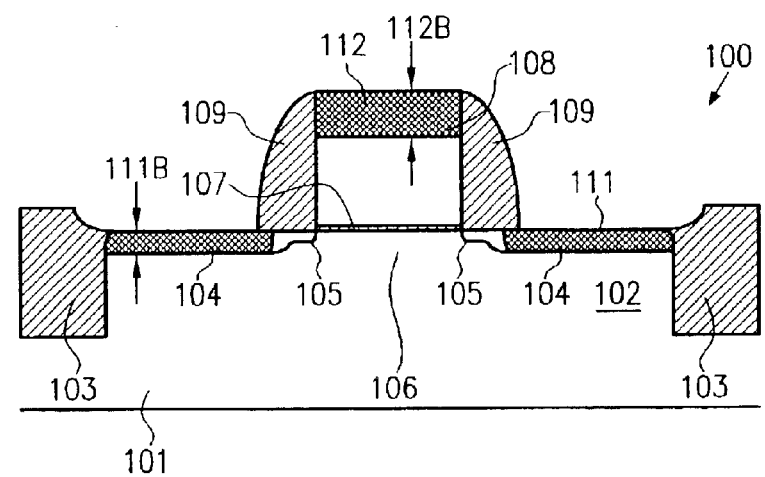
Figure 2B:
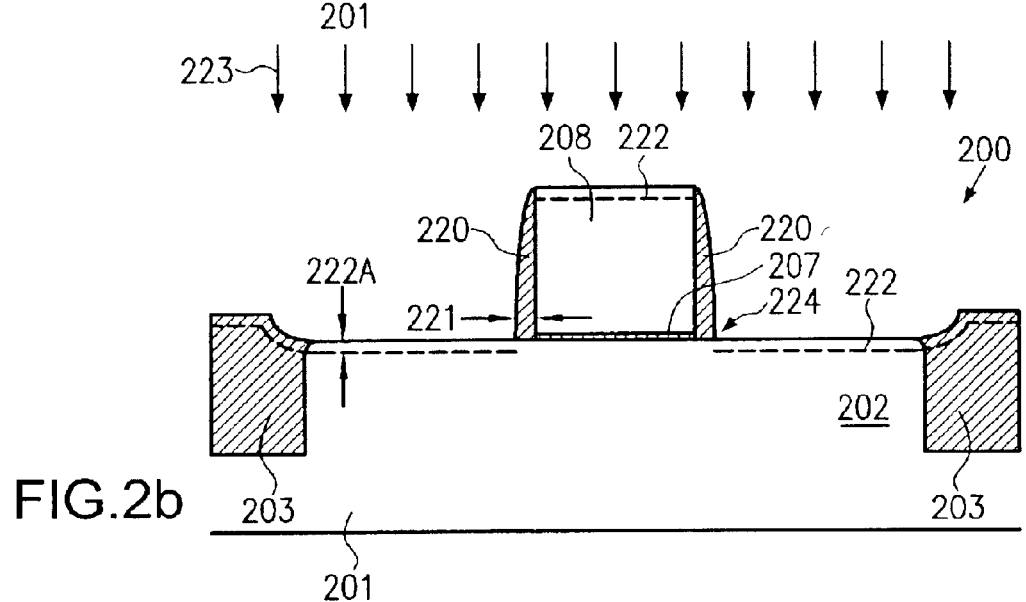

FIG. 2b schematically shows the transistor element 200 during an implantation step, indicated by 223, for introducing a barrier diffusion material such as nitrogen into silicon-containing regions of the active region 202 and the gate electrode 208. For convenience, only a peak concentration of the barrier diffusion material in these regions is shown by a dashed line indicated by 222. It should be noted, however, that, due to the nature of the implantation process, the concentration typically exhibits a profile in the vertical direction with respect to FIG. 2b. The peak concentration 222 is preferably located at a depth 222a that is selected in accordance with the required thickness of a metal silicide layer to be formed in the active region 202. The depth 222a may be adjusted in accordance with a required depth of the junction to be formed, as previously explained with reference to FIGS. 1a–1c, by correspondingly selecting the implantation parameters. For example, the depth 222A may range from approximately 10–100 $\mu$nm. In typical examples, the implantation energy for nitrogen in molecular form as the barrier diffusion material is in the range of 30–60 keV, wherein the dose is selected to approximately $1-5 \times 10^{15}$ atoms/cm$^2$. When implanting single nitrogen ions, the implant energy may be chosen to be approximately 10–40 keV, while the dose may be selected substantially identical to the former case or may be increased to approximately $2 \times 10^{15}$ to $1 \times 10^{16}$ atoms/cm$^2$. Typical values for the peak concentration 222 may range from approximately $1 \times 10^{19}$ to $5 \times 10^{20}$ atoms/cm$^3$. During the implantation 223, the sidewall spacers 220 act as an implantation mask to substantially avoid lattice damage in the vicinity of a bottom edge 224 of the gate electrode 208. At the same time, the integrity of the gate insulation layer 207 is substantially unaffected by the implantation 223.

Thereafter, the sidewall spacers 220 may be removed by any appropriate selective etch process as are well known in the art. In other embodiments, the sidewall spacers 220 may be maintained and may advantageously be used as implantation masks for subsequent implantation steps.

Figure 2C:
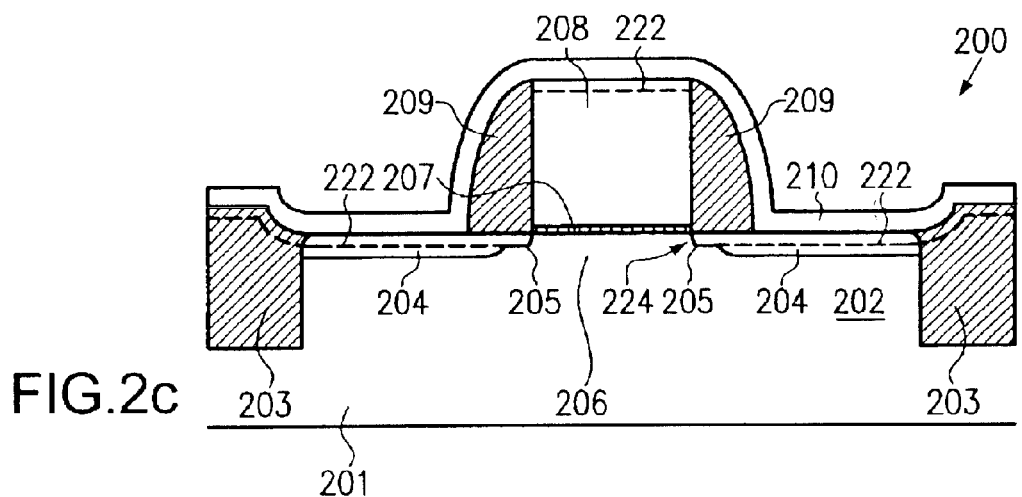

FIG. 2c schematically shows the transistor element 200 in a further advanced manufacturing stage. Source and drain regions 204, with extension regions 205, are formed in the active region 202. Sidewall spacers 209 are formed at the sidewalls of the gate electrode 208 wherein, depending on the process requirements, the sidewall spacers 220, as well as any additional spacer elements possibly used during the formation of the regions 204 and 205, may be removed or may be incorporated in the sidewall spacers 209. Finally, a metal layer 210, which in particular embodiments may be substantially comprised of nickel, is formed over the transistor element 200.

A typical process flow for forming the transistor element 200, as depicted in FIG. 2c, may be as follows. The drain and source regions 204 and the extension regions 205 are formed by appropriately designed implant sequences, wherein one or more types of dopants are implanted into the active region 202. As previously explained, the implantation sequence may include quite complex implantation processes so as to obtain the required vertical and horizontal dopant profile. In particular, in sophisticated transistor elements, the formation of a so-called halo is required to reduce deleterious effects during transistor operation that may occur for gate electrodes having dimensions in the deep sub-micron range. It is thus frequently necessary to implant different types of dopants, such as arsenic, phosphorous, boron, and the like, that create different types of conductivity, wherein, advantageously, the diffusion barrier material implanted into the gate electrode 208 may effectively hinder, for example, boron atoms from diffusion into the gate insulation layer 207 and the underlying channel region 206. Moreover, due to the provision of the sidewall spacers 220, any crystal damage at the bottom edge 224 of the gate electrode 208 is comparable to a conventional process flow, as merely the formation of the extension region 205 significantly contributes to crystalline defects similarly to a conventional process flow. Thus, the process flow in accordance with the illustrative embodiments described above are highly compatible with standard process techniques without compromising device characteristics. The sidewall spacers 209 and the metal layer 210 are formed in a similar manner as already described with reference to FIGS. 1a–1c.

In other embodiments of the present invention, the sidewall spacers 220 may not be formed and the implantation 223 is carried out after a conventional process flow for forming the transistor element 200, as depicted in FIG. 2c, wherein, however, prior to depositing the metal layer 210, the implantation 223 is carried out to position the peak concentration 222 as required for the further processing. In still other embodiments, the implantation 223 may be incorporated into the implantation sequence for forming the drain and source regions 204 and the extension regions 205. For example, one or more spacer elements (not shown) may be used in precisely defining the lateral dopant profile or forming the extension regions 205. Then, by using these spacer elements, the implantation 223 may be carried out, thereby avoiding additional process steps and accomplishing a high degree of compatibility with the standard process flow.

Irrespective of the time when the implantation 223 is carried out, a wet chemical clean process may be performed prior to depositing the metal layer 210, which may be accomplished by any appropriate deposition method, such as CVD or PVD, wherein a thickness of the metal layer 210 is selected in accordance with process requirements.

Thereafter, a heat treatment is performed in order to initiate a chemical reaction between the nickel contained in the metal layer 210 and the silicon of the corresponding portions in the drain and source regions 204 and the gate electrode 208. As previously described with reference to FIGS. 1a–1c, any appropriate heat treatment may be carried out, for example, a rapid thermal anneal, possibly designed as a two-step cycle, wherein a thickness of the metal layer 210 and/or the temperature and/or the duration of the heat treatment are selected to obtain the required thickness of nickel silicide. For example, in forming nickel silicide, the ratio between a silicon thickness consumed and thickness of nickel consumed is approximately 1.83 so that a thickness of the final nickel silicide may readily be adjusted by controlling one or more of the former process parameters. During the heat treatment, the diffusion barrier material, such as the nitrogen, is incorporated into the nickel silicide for purposes of limiting the inter-diffusion of silicon and nickel and the formation of nickel disilicide.

Figure 2D:
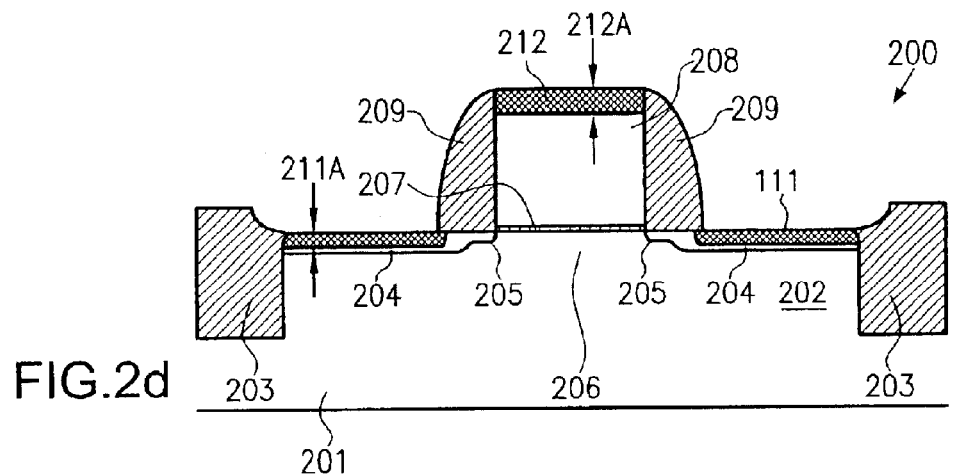

FIG. 2d schematically shows the transistor element 200 after completion of the heat treatment and the subsequent selective removal of non-reacted nickel. In the source and drain regions 204, nickel silicide layers 211 are formed, having a thickness indicated by 211a. Similarly, a nickel silicide layer 212 is formed on top of the gate electrode 208 and has a thickness 212a. The thicknesses 211a and 212a are adjusted as described above, wherein, due to the incorporated diffusion barrier material, such as the nitrogen, a further inter-diffusion of silicon and nickel upon elevated temperatures is significantly hindered and, thus, the generation of nickel disilicide is significantly suppressed. For example, for temperatures as high as approximately 500° C., a 50% roughness improvement at the interface between the nickel silicide layers 211, 212 and the silicon in the gate electrode 208 and the source and drain regions, respectively, may be obtained for a maximum nitrogen concentration corresponding to the peak concentration 222 in the range of approximately $1 \times 10^{19}$ to $5 \times 10^{20}$ atoms/cm$^3$. Thus, the junction integrity and the low sheet resistance of the nickel silicide layers 211, 212 may be substantially maintained even during elevated temperatures at further process steps for completing the transistor element 200.

In advanced transistor elements 200 and also in future circuit generations, the lateral dimension, i.e., the gate length of the gate electrode 208 (in FIG. 2, the horizontal extension of the gate electrode 208), may be scaled down to 0.08 to 0.05 μm and even less. For a correspondingly short channel length, the depth of the corresponding drain and source regions 204 has also been decreased so that the thickness 211a of the nickel silicide layer 211 has to be substantially restricted to surface portions of the drain and source regions 204. In these cases, it may be desirable to provide the diffusion barrier material, such as the nitrogen, in a relatively localized manner so that an enhanced barrier diffusion effect is obtained at the surface portions of the drain and source regions 204, whereas deeper lying regions may remain substantially unaffected by the diffusion barrier material.

Figure 2E:
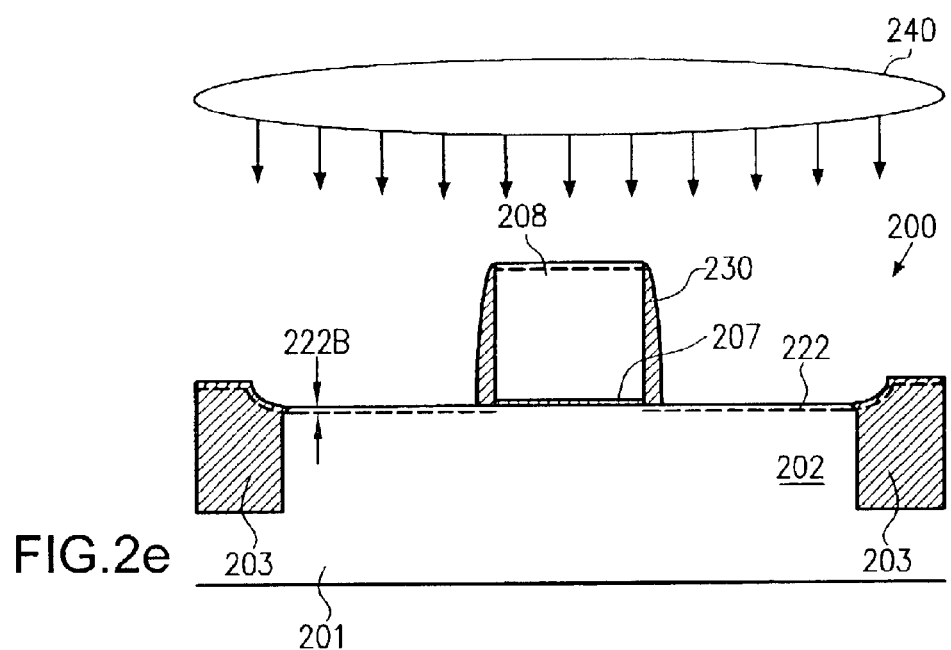

FIG. 2e schematically shows the transistor element 200 in an early manufacturing stage according to a further illustrative embodiment of the present invention. The manufacturing sequence described with reference to FIG. 2e may replace the process flow as described in FIGS. 2a and 2b.

In this case, the gate electrode 208 comprises sidewall spacers 230 which may correspond to the spacers 220 or which may be any additional spacer elements formed for defining the extension regions 205 that have still to be formed. Moreover, the transistor element 200 is exposed to a nitrogen-containing plasma ambient 240 that allows the deposition of nitrogen at surface portions of the active region 202 and the gate electrode 208 in a more precise manner compared to an implantation process.

The plasma ambient 240 may be established by any appropriate process tool allowing for the generation and control of a plasma. For example, deposition tools for plasma enhanced CVD, plasma etch tools, even deposition tools with remote plasma sources may be used. Process parameters of these tools may be controlled to deposit nitrogen at a required depth, as indicated by 222, in the active region 202 and the gate electrode 208. In one embodiment, the sidewall spacers 230 may be omitted and the directionality of the plasma particles may be controlled to substantially move in a direction perpendicular to the substrate 201. In this way, penetration of nitrogen into sidewalls of the gate electrode 208 may be minimized without providing the sidewall spacers 230. In view of not compromising the integrity of the gate insulation layer 207, it may, however, be preferable to introduce the nitrogen in the presence of the sidewall spacers 230.

During the exposure of the substrate 201 to the plasma ambient 240, nitrogen ions and nitrogen radicals hit the surface with relatively low kinetic energy compared to the several keV of an implant process. Thus, damage is significantly reduced compared to the ion implantation as, for example, shown in FIG. 2b. Upon impinging onto the substrate 201, nitrogen is introduced into the active region 202 and the gate electrode 208 both by a minor implantation effect of ionized nitrogen and by chemical reaction of the silicon with the nitrogen radicals.

With the low kinetic energy of those nitrogen particles that are introduced by an implantation effect, the penetration depth is relatively small and thus the concentration of the nitrogen is substantially located at the surface portions of the active region 202 and the gate electrode 208, as indicated by 222. Thus, the introduction of nitrogen is well controllable and allows location of a sufficiently high nitrogen concentration within a precisely defined depth of the active region 202 and the gate electrode 208. For example, by applying a DC bias voltage between the plasma ambient 240 and the substrate 201 in the range of approximately 10–100 volts, the penetration depth of the nitrogen 222 may be controlled within a range of approximately 2–10 nm. After completion of the introduction of nitrogen, further processing may be continued as already described with reference to FIGS. 2c and 2d.

As a result of the present invention, the conversion of nickel silicide into nickel disilicide at elevated temperatures, for example, within a temperature range up to 500° C., may be prevented or at least significantly reduced. The sheet resistance degradation, as typically occurs in the conventional processing of nickel silicide-containing circuit elements, may drastically be reduced while, at the same time, the junction integrity is improved. During various manufacturing stages, a diffusion barrier material, such as nitrogen, may be introduced to the relevant portions of the circuit element, for example, by ion implantation or by plasma deposition, so that the diffusion barrier material is incorporated into the metal silicide layer and suppresses a further reaction at elevated temperatures during later process steps. The time when the diffusion barrier material is introduced may be selected in accordance with process requirements, so that additional synergetic effects may be obtained, such as blocking of boron atoms, or that a high degree of compatibility with standard process techniques is achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a metal silicide, the method comprising:
    providing a substrate having formed thereon a silicon region with a surface area for receiving said metal silicide;
    introducing a diffusion barrier material into the silicon region via said surface area by exposing said substrate to a plasma ambient containing said barrier diffusion material;

depositing a metal layer such that the metal layer is in contact with said surface area;

converting at least a portion of said metal layer into metal silicide to form a metal silicide layer, wherein a portion of said barrier diffusion material is incorporated into said metal silicide layer; and forming drain and source regions in said crystalline region by an implantation sequence, wherein introducing said barrier diffusion material is performed prior to performing said implantation sequence.

2. The method of claim 1, wherein said metal layer comprises nickel.

3. The method of claim 1, further comprising forming a mask element prior to introducing said barrier diffusion material to protect a specified portion of said silicon region.

4. The method of claim 1, wherein converting at least a portion of said metal layer into silicide comprises performing a heat treatment to initiate a chemical reaction between the metal and the silicon, wherein at least one of a treatment time and a temperature is controlled to adjust a thickness of said metal silicide layer.

5. The method of claim 1, wherein said silicon region is at least one of a polysilicon region and a crystalline region of a MOS structure.

6. The method of claim 5, further comprising forming a polysilicon line over said crystalline region.

7. The method of claim 6, further comprising forming a sidewall spacer adjacent to sidewalls of said polysilicon line prior to introducing said barrier diffusion material.

8. The method of claim 7, further comprising forming an insulation layer prior to forming said polysilicon line, said insulation layer separating said polysilicon line from said crystalline region.

9. The method of claim 8, wherein introducing said barrier diffusion material is performed after said implantation sequence.

10. The method of claim 8, wherein introducing said barrier diffusion material is carried out during said implantation sequence.

11. A method of forming a nickel silicide layer in a conductive silicon-containing region, the method comprising:

providing a substrate having formed thereon said conductive silicon-containing region;

introducing nitrogen into said conductive silicon-containing region by exposing said substrate to a nitrogen-containing plasma ambient;

forming a nickel-containing layer over said conductive silicon-containing region, the nickel-containing layer being partially in contact with said conductive silicon-containing region;

converting a portion of said nickel-containing layer into a nitrogen-containing nickel silicide layer; and forming drain and source regions in said conductive silicon-containing region by an implantation sequence, wherein introducing said nitrogen is performed prior to performing said implantation sequence.

12. The method of claim 11, further comprising forming a mask element prior to introducing nitrogen to protect a specified portion of said conductive silicon-containing region.

13. The method of claim 11, wherein converting at least a portion of said nickel-containing layer into nickel silicide comprises performing a heat treatment to initiate a chemical reaction between the nickel and the silicon, wherein at least one of a treatment time and a temperature is controlled to adjust a thickness of said nitrogen-containing nickel silicide layer.

14. The method of claim 11, wherein said conductive silicon-containing region is at least one of a polysilicon region and a crystalline region of a MOS structure.

15. The method of claim 11, further comprising forming a polysilicon line over said conductive silicon-containing region.

16. The method of claim 15, further comprising forming a sidewall spacer adjacent to sidewalls of said polysilicon line prior to introducing the nitrogen.

17. The method of claim 15, further comprising forming an insulation layer prior to forming said polysilicon line, said insulation layer separating said polysilicon line from said conductive silicon-containing region.

18. The method of claim 17, wherein introducing said nitrogen is performed after said implantation sequence.

19. The method of claim 17, wherein introducing said nitrogen is carried out during said implantation sequence.

20. The method of claim 11, further comprising forming a screen layer, at least partially covering said conductive silicon-containing region, prior to introducing said nitrogen.

21. A method of forming a metal silicide, the method comprising:

providing a substrate having formed theron a silicon region with a surface area for receiving said metal silicide;

introducing a diffusion barrier material into the silicon region via said surface area;

depositing a metal layer such that the metal layer is in contact with said surface area;

converting at least a portion of said metal layer into metal silicide to form a metal silicide layer, wherein a portion of said barrier diffusion material is incorporated into said metal silicide layer; and forming drain and source regions in said crystalline region by an implantation sequence wherein said step of introducing said barrier diffusion material is performed prior to performing said implantation sequence.

22. The method of claim 21, wherein introducing said barrier diffusion material comprises exposing said substrate to a plasma ambient containing said barrier diffusion material.

23. A method of forming a nickel silicide layer in a conductive silicon-containing region, the method comprising:

providing a substrate having formed thereon said conductive silicon-containing region;

introducing nitrogen into said conductive silicon-containing region;

forming a nickel-containing layer over said conductive silicon-containing region, the nickel-containing layer being partially in contact with said conductive silicon-containing region;

converting a portion of said nickel-containing layer into a nitrogen-containing nickel silicide layer; and forming drain and source regions in said conductive silicon-containing region by an implantation sequence, wherein the step of introducing said nitrogen is performed prior to performing said implantation sequence.

24. The method of claim 23, wherein introducing nitrogen comprises exposing said substrate to a nitrogen-containing plasma ambient.

* * * * *